United States Patent [19]
Oldenkamp

[11] Patent Number: 6,163,157
[45] Date of Patent: Dec. 19, 2000

[54] INSULATION TESTER FOR SQUIRREL CAGE ROTORS

[75] Inventor: John Oldenkamp, Ft. Wayne, Ind.

[73] Assignee: General Electric Co., Schenectady, N.Y.

[21] Appl. No.: 09/251,361

[22] Filed: Feb. 17, 1999

[51] Int. Cl.[7] .................................................. G01R 31/12
[52] U.S. Cl. ........................................... 324/545; 324/772
[58] Field of Search ..................................... 324/772, 222, 324/545, 551, 510

[56] References Cited

U.S. PATENT DOCUMENTS

| | | | |
|---|---|---|---|
| 4,097,794 | 6/1978 | Burrus | 324/510 |
| 5,134,378 | 7/1992 | Twerdochild | 324/545 |
| 5,468,066 | 11/1995 | Ito et al. | 324/551 |
| 5,712,572 | 1/1998 | Tamechika et al. | 324/551 |

*Primary Examiner*—Safet Metjahic
*Assistant Examiner*—Vincent Q Nguyen
*Attorney, Agent, or Firm*—Welsh & Katz, Ltd.; Carl B. Horton; Wayne O. Traynham

[57] ABSTRACT

A method and apparatus are provided for measuring a quality of insulation surrounding rotor bars of a rotor of a squirrel cage motor. The method includes the steps of applying an alternating magnetic flux to opposing ends of the rotor measuring a power level absorbed by the rotor as a result of the applied alternating magnetic flux. The method further includes the step of using the measured power level as a relative measure of the quality of the insulation of the rotor bars.

28 Claims, 2 Drawing Sheets

INSULATION TESTER FOR SQUIRREL CAGE ROTORS

BACKGROUND OF THE INVENTION

The field of the invention relates to electrical motors and more particularly to induction motors.

Induction motors, such as squirrel cage induction motors, are in common use. Such motors, because of their simplicity and reliability, are one of the most widely used electric motors in use today.

While squirrel cage induction motors are cheap and effective, the rotor windings on such motors are often difficult to manufacture. In order to function properly, the windings of the rotor must be insulated from the underlying rotor laminations. Where the winding insulation is insufficient, the windings may short to the lamination and, ultimately, to each other. Such shorting leads to a reduction of efficiency and ultimately to failure of the motor. Because of the importance of squirrel cage motors a need exists for a means of evaluating the insulation quality of the rotor.

SUMMARY

A method and apparatus are provided for measuring a quality of insulation surrounding rotor bars of a rotor of a squirrel cage induction motor. The method includes the steps of applying an alternating magnetic flux to opposing ends of the rotor measuring a power level absorbed by the rotor as a result of the applied alternating magnetic flux. The method further includes the step of using the measured power level as a relative measure of the quality of the insulation of the rotor bars.

The application of an alternating magnetic flux may be performed without complicated equipment or procedures. The relative power absorbed by the rotor provides a reliable measure of the quality of the insulation of the rotor and, consequently, of the efficiency of its operation. The efficiency of a motor is an important factor in not only saving energy, but also in extending a service life of the motor by reducing internal heating.

DETAILED DESCRIPTION OF A PREFERRED EMBODIMENT

Figure 1:
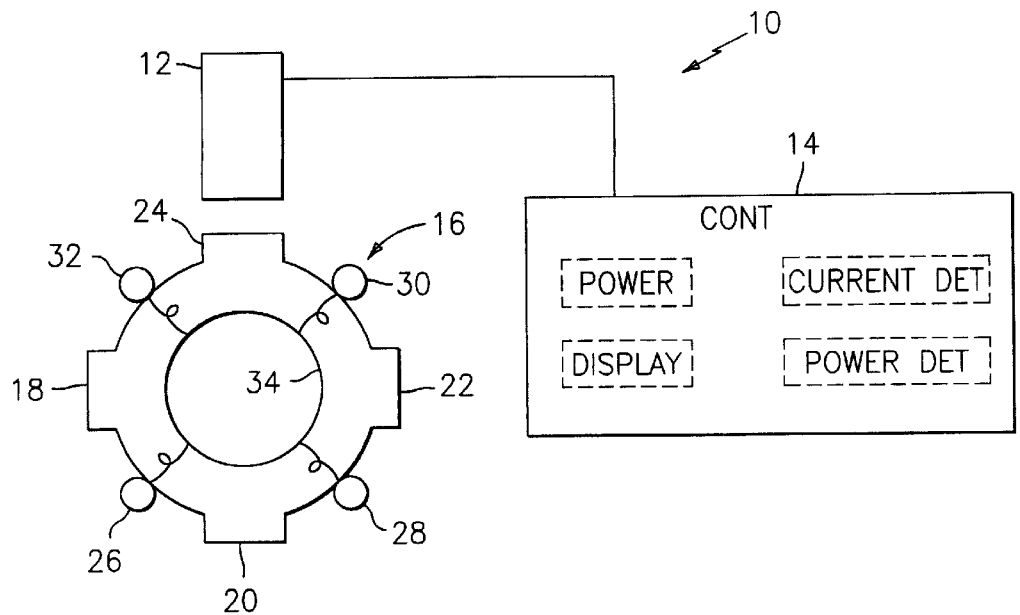
FIG. 1 depicts a block diagram of an insulation tester and tested rotor in accordance with an illustrated embodiment of the invention.

FIG. 1 shows a rotor insulation tester 10, generally, in accordance with an illustrated embodiment of the invention. Included within the insulation tester 10 is an electromagnet 12 and insulation tester controller 14. Also shown in FIG. 1 is an end view of a rotor 16 of a squirrel cage induction motor.

While the rotor 16 forms no part of the invention, the rotor 16 is shown for purposes of understanding the invention. Reference shall be made to the rotor 16 as necessary to an understanding of the invention.

Included within the rotor 16 of FIG. 1 are a number of teeth 18, 20, 22, 24 (four shown) which interact with a stator (not shown) to provide a flux path through the rotor 16. A number of rotor bars 26, 28, 30, 32 (four shown) are also shown disposed between the teeth, skewed or parallel to a longitudinal axis of the rotor 16. Each rotor bar 26, 28, 30, 32 may be connected at opposing ends to a respective end ring 34, 44 (end ring 34 is shown schematically in FIG. 1).

The rotor bars and end rings together form a series of shorted turns in which current is induced by operation of the stator. To ensure proper operation, the bars and end rings are insulated from the teeth and metallic flux paths lying underneath the bars and end rings.

Figure 2:
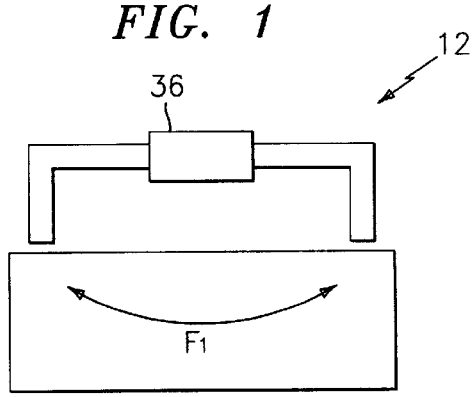
FIG. 2 depicts a side view of the electromagnet and rotor of the system of FIG. 1.

FIG. 2 is a side view of the rotor 16 and electromagnet 12 of FIG. 1. As shown, the electromagnet 12 is disposed against the rotor 16 with opposing poles of the electromagnet 12 disposed against opposing ends of a single tooth 24 of the rotor 16. It is to be understood that the poles of the electromagnet 12 could be disposed against any tooth 18, 20, 22, 24 of the rotor 16 for the testing of the insulation of adjacent rotor bars.

FIG. 2 also shows a flux path F1 that may be created within the rotor 16 (between opposing poles of the electromagnet 12) upon application of an alternating current to a winding 36 of electromagnet 12. As shown, the flux path F1 enters through a tooth (in this case tooth 24) on one side of FIG. 2, proceeds longitudinal along the rotor 16, (perpendicularly to the rotor laminations) from a first end of the rotor 16 to a second end of the rotor 16 and again exits through the tooth.

Figure 3:
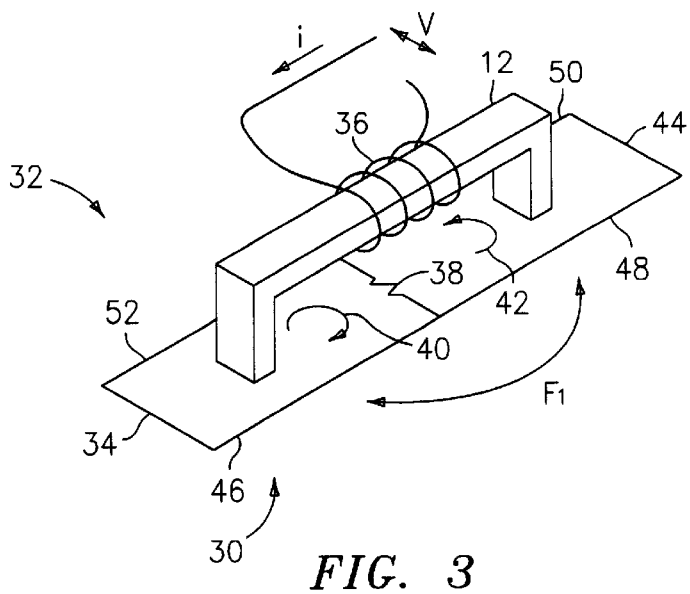
FIG. 3 depicts a schematic circuit of circuits detected by the system of FIG. 1.

FIG. 3 shows a schematic representation of a pair of circuits 40, 42 that may be created within the rotor 16 due to poor insulation. Current may be induced in these circuits 40, 42 in response to magnetic flux flowing within the flux path F1. The first circuit 40 may be formed on the left side of FIG. 3 by a left bar portion 46 of rotor bars 30 and a left bar portion 52 of bar 32 and end ring 34. The first circuit 40 is completed by a failure in the insulation between bars 30 and 32 (shown schematically as resistor 38 in FIG. 3 joining bars 30 and 32).

Similarly, the second circuit 42 may be formed on the right side of FIG. 3 by bar portions 48 and 50 (of rotor bars 30 and 32) and right end ring 44. The second circuit 42 is completed by resistor 38 joining bars 30 and 32).

As should be apparent from FIG. 3, the first circuit 40 encloses flux from the left leg (pole) of electromagnet 12. Where current "i" flows in a positive direction of the winding 36, an opposing current will flow as shown in the first circuit 40.

Similarly, the second circuit 42 encloses from the right leg (pole) of electromagnet 12. Where current "i" flows in a positive direction of the winding 36, an opposing current will flow as shown in the second circuit 42.

As should also be apparent from FIG. 3, if the resistor 38 were now assumed to be an open circuit (i.e., the insulation of bars 30, 32 was intact) no current would flow in bars 30, 32 and end rings 34, 44. No current would flow because the flux of the left leg would cancel the flux in the right leg and the net flux through the large circuit formed around flux path F1 by bars 30 and 32 and end rings 34, 44 would be zero.

Under the illustrated embodiment, a measure of insulation integrity is obtained by the real power absorbed by the rotor 16. For example, if resistor 38 were an open circuit, then the current "i" flowing in the winding 36 would predominantly consist of magnetizing currents. The only real power absorbed by the rotor 16 would be in the eddy currents induced in the laminations.

To measure real power, the controller 14 measures a magnitude and phase of the current "i". Power may then be calculated within the controller 14 by evaluating the expression, P=VI cos θ, where θ is the measured phase difference between the induced voltage and measured current.

The induced voltage may be measured through the use of a bifilar winding 36. While an energizing voltage is applied to a first conductor of the bifilar winding, the voltage (from which real power may be determined) is measured on a second conductor of the bifilar winding. The use of a bifilar winding reduces error in real power measurement by eliminating $I^2R$ loss existing in the first conductor from the real power calculation.

Figure 4:
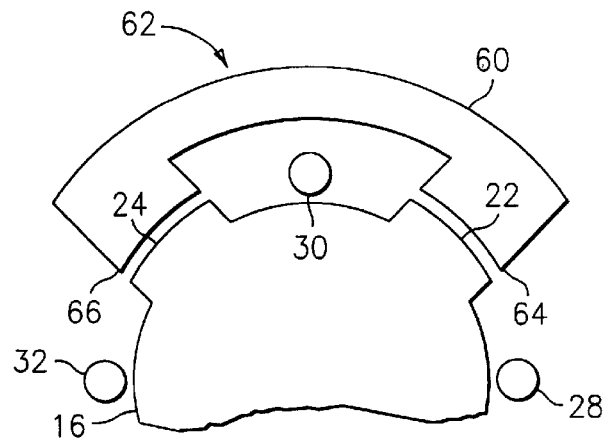
FIG. 4 depicts an alternate electromagnet arrangement and rotor of the system of FIG. 1.
Figure 5:
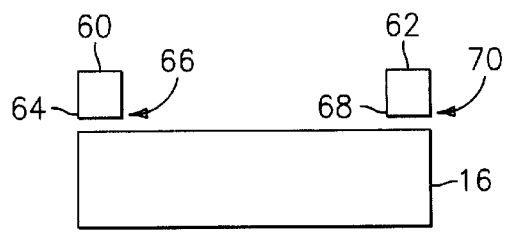
FIG. 5 depicts a side view of the electromagnetic arrangement and rotor of FIG. 4.

In another illustrated embodiment of the invention, a pair of electromagnets 60, 62 are applied across a pair of adjacent teeth 22, 24 of the rotor 16 as shown in FIGS. 4 and 5. A first electromagnet 60 may be applied across the pair of teeth 22, 24 on one end of the rotor 16 while a second electromagnet 62 is applied across the same set of teeth 22, 24 at an opposing end of the rotor 16. Using a pair of electromagnets 60, 62 produces a pair of flux paths (one at each end between opposing legs of the respective electromagnets 60, 62).

Figure 6:
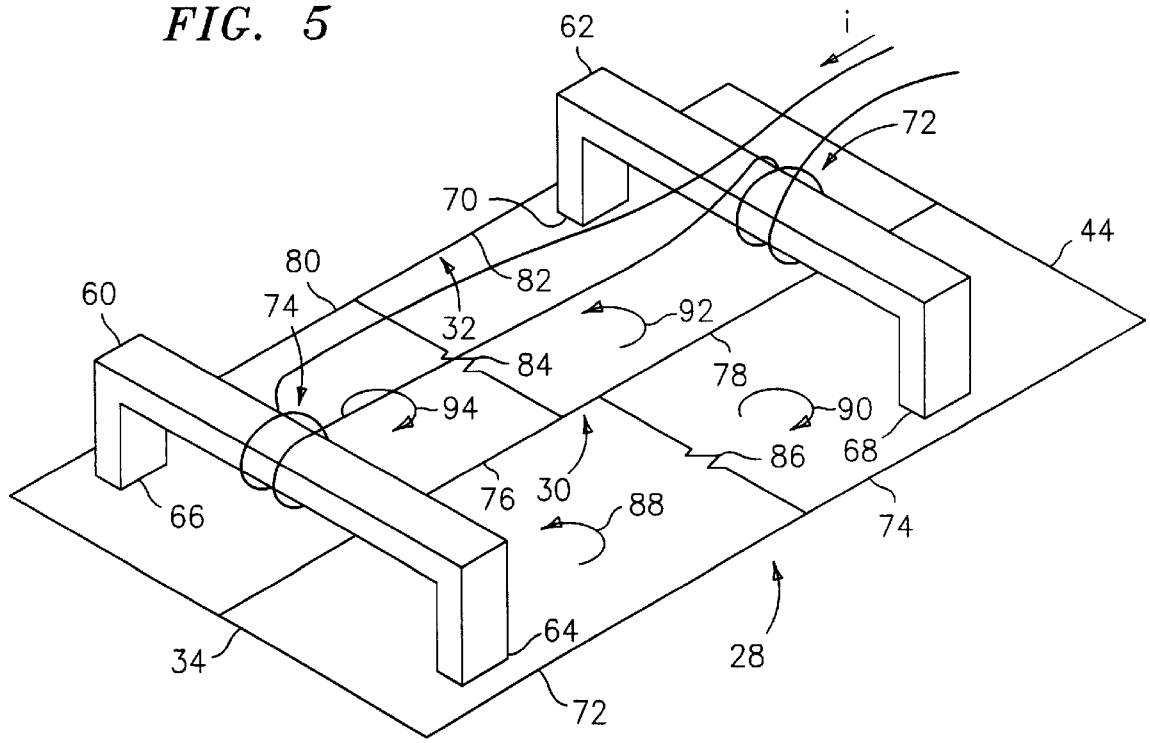
FIG. 6 depicts a schematic of circuits detected by the system of FIG. 1.

Further, each electromagnet 60, 62 is provided with a separate winding 72, 74 (shown in FIG. 6). The windings 72, 74 of the electromagnets 60, 62 are connected in series and are wound in an opposite direction.

Placing the winding 72, 74 in series with an opposing winding direction allows for a net magnetic flux of zero in each tooth. Stated differently, when electromagnets 60, 62 are placed at opposite ends of the lamination stack, no net flux linkage exists with the rotor as long as the rotor is well insulated. The flux return path between electromagnets 62 and 64 is across the stack of laminations. In the case illustrated by FIG. 6, not only is the net flux in each tooth equal to zero, but the net flux at each end of the stack is also zero. In this case the flux return path is through the laminations, rather than across them, since this is the path of minimum reluctance.

Providing a net flux of zero between the teeth 18, 20, 22, 24 and electromagnets 60, 62 eliminates rotor cage current losses in the rotor 16. Eliminating rotor current losses greatly improves the accuracy of insulation testing accomplished by the insulation tester 10.

Turning now to FIG. 6 the circuits created by poor insulation between the rotor bars will now be discussed. As shown, the electromagnets 60, 62 are shown as spanning teeth 22 and 24. As shown a first bar 28 is shown extending past both electromagnets 60, 62 on a front side. A second bar 30 passes through the two electromagnets 60, 62. A third bar 32 is shown extending past both electromagnets 60, 62 on a rear side. End rings 34, 44 connect the opposite ends of the bars 28, 30, 32.

A pair of resistors 84, 86 are used to indicate poor insulation. Resistor 84 is used to indicate poor insulation between bars 30 and 32. Resistor 86 is used to indicate poor insulation between bars 30 and 28.

Based upon the presence of the resistors 84, 86, at least four circuits 88, 90, 92, 94 may exist within the rotor 16. A first circuit 88 includes a first portion 72 of bar 28, resistor 86, a first portion 76 of bar 30 and end ring 34. A second circuit 90 includes a second portion 74 of bar 28, end ring 44, a second portion 78 of bar 30 and resistor 86. A third circuit 92 includes the second portion 78 of bar 30, end ring 44, a second portion 82 of bar 32 and resistor 84. A fourth circuit 94 includes the first portion 76 of bar 30, resistor 84, a first portion 80 of bar 32 and end ring 34.

As can be observed from FIG. 6, flux from the first pole 64 of the first electromagnet 60 is enclosed by the first circuit 88, while flux from the first pole 68 of the second electromagnet 62 is enclosed by the second circuit 90. Since the flux from the first pole 64 is equal and opposite to flux from the first pole 68, there is no net flux through the large circuit formed by bars 28 and 30 and end rings 34 and 44. Since no flux is enclosed by the large circuit, no current flows around the large circuit. For the same reason, no current flows around the large circuit formed by bars 30 and 32 and end rings 34 and 44. Also, since the net flux of the four poles 64, 66, 68, 70 of the two electromagnets 60, 62 is zero, there is not current flowing through the large circuit formed by outside bars 28 and 32 and end rings 34 and 44.

To measure insulation quality, the controller 14 applies a voltage to the input shown in FIG. 6 of the pair of electromagnets 60, 62. Upon applying the voltage, the controller 14, in turn, measures a magnitude and phase of any current, "i", flowing through the electromagnets 60, 62. From the voltage and magnitude and phase of the current the controller 14 measures a real power absorbed by the rotor 16 as a measure of insulation quality.

From the level of power absorbed by the rotor 16 an evaluation of insulation quality may be made. If resistors 84, 86 are both open circuits (i.e., the insulation between bars 28, 30, 32 is of a very high quality), then very little real power will be absorbed by the rotor 16 when the electromagnets 60, 62 are placed over the first set of teeth 22, 24. If only one resistor (e.g., resistor 84) is open circuited, then a lesser amount of power will be absorbed and the presence of a short between only one set of bars (i.e., bars 28 and 30) may be detected.

After the electromagnets 60, 62 are placed on the first set of teeth 22, 24 and testing of bars 28, 30, 32 is completed, the electromagnets 60, 62 may be moved to the next set of teeth 20, 22. Once moved to the next set of teeth 20, 22, the insulation of another set of bars 26, 28, 30 may be tested.

In another embodiment of the invention, one of the electromagnets 60, 62 may be removed from a set of teeth to check for broken rotor bars. For example, in the case where the electromagnets 60, 62 are placed on teeth 22 and 24, the second electromagnet 62 may be detached from the rotor 16. Then, if bar 30 is open, the loop formed by bars 28 and 32 will have no net flux, and no rotor currents will result (the electromagnet, 60 or 62 should be placed in the center of the stack, straddling the box 30).

In the case where the bar 30 is intact, since the net flux through the large circuits (first circuit elements 28, 44, 30 and 34 and second circuit elements 30, 44, 32 and 34) is now non-zero, current will flow. By measuring the presence or absence of current, broken bars may be detected. By moving the remaining electromagnet 60 to one side or the other where a low reading is detected, it is possible to precisely determine the location of one or more broken bars.

A specific embodiment of a method and apparatus for measuring insulation quality according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention, any and all modifications, variations, or equivalents that fall within the true spirit and scope of the basic underlying principles disclosed and claimed herein.

What is claimed is:

1. A method of measuring a quality of insulation surrounding rotor bars of a rotor of a squirrel cage motor, such method comprising the steps of:
    applying an alternating magnetic flux to opposing ends of the rotor;
    measuring a power level absorbed by the rotor as a result of the applied alternating magnetic flux; and
    displaying the measured power level as a relative measure of the quality of the insulation of the rotor bars.

2. The method of measuring the quality of insulation of a squirrel cage motor as in claim 1 wherein the step of applying the alternating magnetic flux further comprises applying opposing poles of an electromagnet to respective opposing ends of a tooth of the rotor.

3. The method of measuring the quality of insulation of a squirrel cage motor as in claim 2 wherein the step of applying the electromagnet further comprises energizing a winding of the electromagnet with an alternating voltage.

4. The method of measuring the quality of insulation of a squirrel cage motor as in claim 3 wherein the step of applying the alternating voltage to the winding further comprises measuring a magnitude and phase of a current induced in the winding of the magnet by the alternating voltage.

5. The method of measuring the quality of insulation of a squirrel cage motor as in claim 4 wherein the step of measuring the current further comprises determining the power level absorbed in the rotor based upon the measured magnitude and phase of the current induced in the winding of the electromagnet by the alternating voltage.

6. The method of measuring the quality of insulation of a squirrel cage motor as in claim 1 wherein the step of applying the alternating magnetic flux further comprises applying a first and second electromagnet to a set of adjacent teeth at opposing ends of the rotor.

7. The method of measuring the quality of insulation of a squirrel cage motor as in claim 6 wherein the step of applying the first and second electromagnet further comprises energizing a winding of the first and second electromagnet with an alternating voltage of opposite polarity between the first and second electromagnets so that a net flux exchanged between a tooth of the set of teeth and the first and second electromagnets is zero.

8. The method of measuring the quality of insulation of a squirrel cage motor as in claim 7 wherein the step of applying the alternating voltage to the windings further comprises measuring a magnitude and phase of a current induced in the windings of the first and second electromagnets by the alternating voltage.

9. The method of measuring the quality of insulation of a squirrel cage motor as in claim 8 wherein the step of measuring the current further comprises determining the power level absorbed in the rotor based upon the measured magnitude and phase of the current induced in the windings of the electromagnets by the alternating voltage.

10. Apparatus for measuring a quality of insulation surrounding rotor bars of a rotor of a squirrel cage motor, such apparatus comprising:
    means for applying an alternating magnetic flux to opposing ends of the rotor;
    means for measuring a power level absorbed by the rotor as a result of the applied alternating magnetic flux; and
    means for displaying the measured power level as a relative measure of the quality of the insulation of the rotor bars.

11. The apparatus for measuring the quality of insulation of a squirrel cage motor as in claim 10 wherein the means for applying the alternating magnetic flux further comprises means for generating a single flux path.

12. The apparatus for measuring the quality of insulation of a squirrel cage motor as in claim 11 further comprising means for energizing the single flux path with an alternating voltage.

13. The apparatus for measuring the quality of insulation of a squirrel cage motor as in claim 12 further comprising means for measuring a magnitude and phase of a current induced in the alternating voltage.

14. The apparatus for measuring the quality of insulation of a squirrel cage motor as in claim 13 further comprising means for determining a power level absorbed in the rotor based upon the measured magnitude and phase of the current induced by the alternating voltage.

15. The apparatus for measuring the quality of insulation of a squirrel cage motor as in claim 10 further comprising means located at opposing ends of the rotor for generating a separate flux path at each end of the rotor.

16. The apparatus for measuring the quality of insulation of a squirrel cage motor as in claim 15 further comprising means for energizing the separate flux path at each end of the rotor with an alternating voltage of opposite polarity so that a net flux exchanged between each tooth of the rotor and the means for generating is zero.

17. The apparatus for measuring the quality of insulation of a squirrel cage motor as in claim 16 further comprising means for measuring a magnitude and phase of a current induced by the alternating voltage.

18. The apparatus for measuring the quality of insulation of a squirrel cage motor as in claim 17 wherein the means for measuring the current further comprises means for determining the power level absorbed in the rotor based upon the measured magnitude and phase of the current induced by the alternating voltage.

19. Apparatus for measuring a quality of insulation surrounding rotor bars of a rotor of a squirrel cage motor, such apparatus comprising:
    an electromagnet adapted to apply an alternating magnetic flux to opposing ends of the rotor;
    a current detector for measuring a magnitude and phase of a current of the alternating magnetic flux applied to opposing ends of the rotor; and
    a power detector for determining a power absorbed by the rotor as a result of the applied alternating magnetic flux.

20. The apparatus for measuring the quality of insulation of a squirrel cage motor as in claim 19 further comprising an electromagnet adapted to applying the magnetic flux to respective opposing ends of a tooth of the rotor.

21. The apparatus for measuring the quality of insulation of a squirrel cage motor as in claim 20 further comprises a power supply coupled to the electromagnet.

22. The apparatus for measuring the quality of insulation of a squirrel cage motor as in claim 21 further comprising a current detector coupled to the power supply for measuring a magnitude and phase of a current induced in the winding of the electromagnet by the alternating voltage.

23. The apparatus for measuring the quality of insulation of a squirrel cage motor as in claim 22 further comprises a power detector for determining the power level absorbed in the rotor based upon the measured magnitude and phase of the current induced in the winding of the electromagnet by the alternating voltage.

24. The apparatus for measuring the quality of insulation of a squirrel cage motor as in claim 19 wherein the electromagnet further comprises a first and second electromagnet disposed at opposing ends of the rotor for applying the alternating magnetic flux to opposing ends of the rotor.

25. The apparatus for measuring the quality of insulation of a squirrel cage motor as in claim 24 wherein the first and second electromagnet further comprises series connected coils and a power supply for applying an alternating voltage so that a net flux exchanged between any tooth of the rotor and the electromagnets is zero.

26. The apparatus for measuring the quality of insulation of a squirrel cage motor as in claim 25 wherein the power supply further comprises a current detector for measuring a magnitude and phase of a current induced in the first and second coils by the alternating voltage.

27. The apparatus for measuring the quality of insulation of a squirrel cage motor as in claim 26 further comprises a power detector adapted to determine a power level absorbed in the rotor based upon the measured magnitude and phase of the current induced by the alternating voltage.

28. Apparatus for measuring a rotor bar quality of rotor bars of a rotor of a squirrel cage motor, such apparatus comprising:

means for applying an alternating magnetic flux to adjacent teeth of the rotor;

means for measuring an electrical parameter induced by the alternating magnetic flux applied to the adjacent teeth of the rotor;

means for displaying the measured parameter drawn by the rotor as a result of the applied alternating magnetic flux.

* * * * *